United States Patent
Kim

(10) Patent No.: US 7,570,095 B2
(45) Date of Patent: Aug. 4, 2009

(54) PHASE SPLITTERS

(75) Inventor: Young-sik Kim, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/730,303

(22) Filed: Mar. 30, 2007

(65) Prior Publication Data

US 2007/0247205 A1   Oct. 25, 2007

(30) Foreign Application Priority Data

Apr. 21, 2006   (KR) ...................... 10-2006-0036321

(51) Int. Cl.
*H03K 3/00* (2006.01)
(52) U.S. Cl. .................. 327/231; 327/256; 327/291
(58) Field of Classification Search .................. None
See application file for complete search history.

(56) References Cited

U.S. PATENT DOCUMENTS 4,782,253 A  11/1988  Shoji ........................... 326/17

6,583,656 B1 *  6/2003  Liu ............................. 327/170
7,119,602 B2 * 10/2006  Davis .......................... 327/415

FOREIGN PATENT DOCUMENTS

JP  05-100763  4/1993
KR  10-2005-0006885  1/2005

* cited by examiner

*Primary Examiner*—An T Luu
(74) *Attorney, Agent, or Firm*—Harness, Dickey & Pierce, P.L.C.

(57) ABSTRACT

A phase splitter that receives an external clock signal and that generates first and second internal clock signals having a phase difference of 180° between the first and second internal clock signals, the phase splitter including: a first buffer that buffers the external clock signal and outputs a first signal; an inverting unit that inverts the external clock signal and outputs a second signal; a second buffer that buffers the second signal and outputs a third signal; a first interpolating signal generator that inverts the external clock signal and outputs a fourth signal; and a second interpolating signal generator that inverts the second signal and outputs a fifth signal. The first signal and the fifth signal are interpolated to generate the first internal clock signal. The third signal and the fourth signal are interpolated to generate the second internal clock signal.

22 Claims, 5 Drawing Sheets

PHASE SPLITTERS

PRIORITY STATEMENT

This application claims priority from Korean Patent Application No. 10-2006-00036321, filed on Apr. 21, 2006, in the Korean Intellectual Property Office (KIPO), the entire contents of which are incorporated herein by reference.

BACKGROUND

1. Field

Example embodiments relate to phase splitters. Also, example embodiments relate to phase splitters used in memory integrated circuits operating in synchronization with a clock signal.

2. Description of Related Art

A phase splitter receives an external clock signal and splits the clock signal to generate two clock signals having a phase difference of 180° between them. The phase splitter is generally used in a memory integrated circuit operating in synchronization with a clock signal, for example, a synchronous dynamic random access memory (SDRAM).

FIG. 1 is a circuit diagram of a conventional phase splitter 101. Referring to FIG. 1, the conventional phase splitter 101 receives an external clock signal CLK and generates a first internal clock signal CLKB having a phase difference of 180° with the external clock signal CLK and a second internal clock signal CLK1 having the same phase as the external clock signal CLK.

The first internal clock signal CLKB is output through a first path X on which three inverters 111, 112, and 113, connected in series, are arranged. The first internal clock signal CLKB has a phase difference of 180° with the external clock signal CLK because the first path X has an odd number of inverters 111, 112, and 113.

The second internal clock signal CLK1 is output through a second path Y on which two inverters 121 and 122, connected in series, are arranged. The second internal clock signal CLK1 has the same phase as the external clock signal CLK because the second path Y has an even number of inverters 121 and 122. Accordingly, a phase difference between the first internal clock signal CLKB and the second internal clock signal CLK1 is 180°.

However, the generation of the second internal clock signal CLK1 precedes generation of the first internal clock signal CLKB because the number of inverters on the first path X is greater than the number of inverters on the second path Y by one inverter. That is, a delay of the first internal clock signal CLKB output through the first path X is longer than a delay of the second internal clock signal CLK1 output through the second path Y. This delay difference generates a skew between the first internal clock signal CLKB and the second internal clock signal CLK1. This skew may become more severe due to variations in process, voltage, and/or temperature (PVT).

FIG. 2 illustrates a falling skew, between the first internal clock signal CLKB and the second internal clock signal CLK1 output from the conventional phase splitter 101 illustrated in FIG. 1, in response to PVT variations. Referring to FIG. 2, the falling skew between the first internal clock signal CLKB and the second internal clock signal CLK1 has a variation range from about +20 picoseconds (ps) to about −16 picoseconds in response to the PVT variations.

FIG. 3 illustrates a rising skew, between the first internal clock signal CLKB and the second internal clock signal CLK1 output from the conventional phase splitter 101 illustrated in FIG. 1, in response to PVT variations. Referring to FIG. 3, the rising skew between the first internal clock signal CLKB and the second internal clock signal CLK1 has a variation range from about +14 picoseconds to about −12 picoseconds in response to the PVT variations.

In the conventional phase splitter 101, as described above, the skew is generated between the first internal clock signal CLKB and the second internal clock signal CLK1 because the number of inverters in the first path X is greater than the number of inverters in the second path Y. Furthermore, the falling skew and the rising skew between the first internal clock signal CLKB and the second internal clock signal CLK1 have very large variation ranges. These variation ranges may become larger due to changes in PVT.

Large variations in the falling skew and rising skew between the first internal clock signal CLKB and the second internal clock signal CLK1 may cause error in data output from a semiconductor memory device (not shown) operating in synchronization with the first internal clock signal CLKB and the second internal clock signal CLK1. To prevent this, the skew between the first internal clock signal CLKB and the second internal clock signal CLK1 should be reduced.

SUMMARY

Example embodiments may provide phase splitters that split a single clock signal input to the phase splitters to generate a plurality of clock signals and/or to minimize skew between the plurality of clock signals due to PVT variations.

According to example embodiments, phase splitters may receive an external clock signal and may generate first and second internal clock signals having a phase difference of 180° between the first and second internal clock signals. The phase splitters may include a first buffer that buffers the external clock signal and outputs a first signal, an inverting unit that inverts the external clock signal and outputs a second signal, a second buffer that buffers the second signal and outputs a third signal, a first interpolating signal generator that inverts the external clock signal and outputs a fourth signal, and a second interpolating signal generator that inverts the second signal and outputs a fifth signal. The first signal and the fifth signal may be interpolated to generate the first internal clock signal. The third signal and the fourth signal may be interpolated to generate the second internal clock signal.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
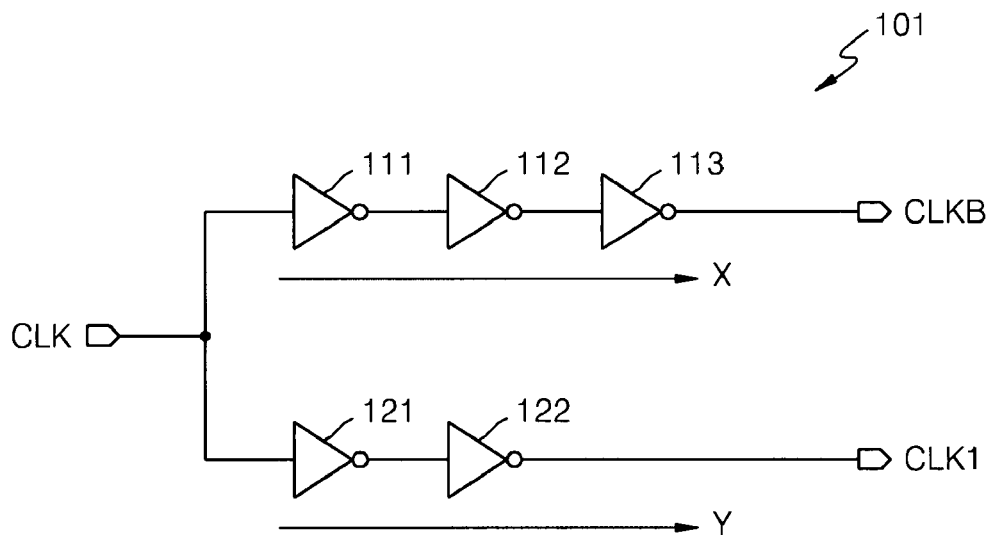
FIG. 1 is a circuit diagram of a conventional phase splitter.
Figure 2:
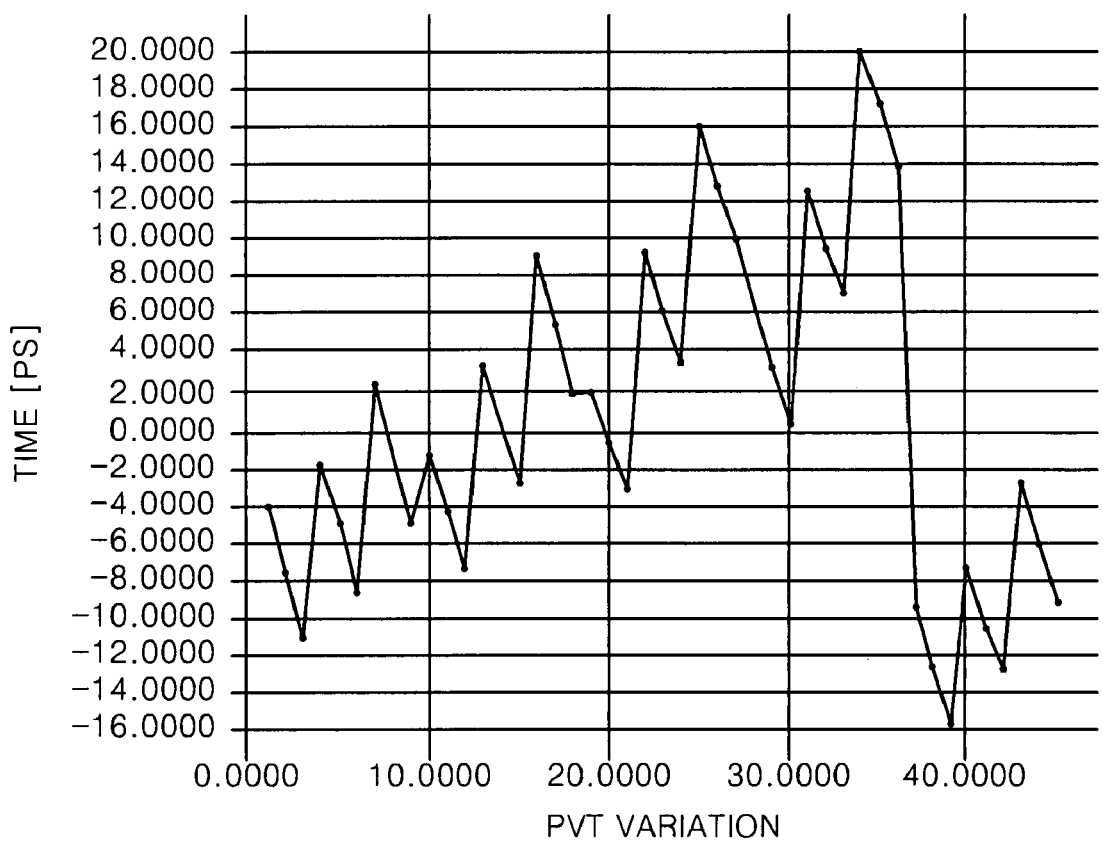
FIG. 2 illustrates a falling skew between first and second internal clock signals output from the phase splitter illustrated in FIG. 1 in response to PVT variations.
Figure 3:
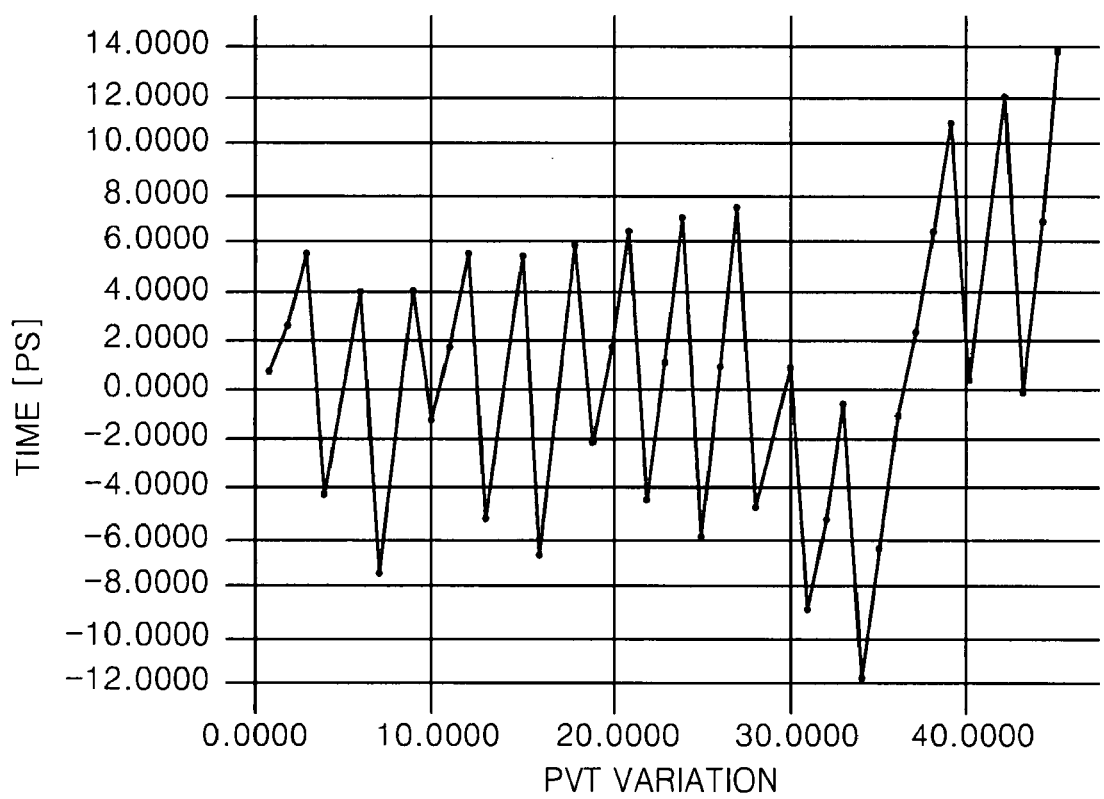
FIG. 3 illustrates a rising skew between first and second internal clock signals output from the phase splitter illustrated in FIG. 1 in response to PVT variations.

Example embodiments will now be described more fully with reference to the accompanying drawings. Embodiments, however, may be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," or "coupled to" another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments that may be illustrated in the accompanying drawings, wherein like reference numerals may refer to the like components throughout.

Figure 4:
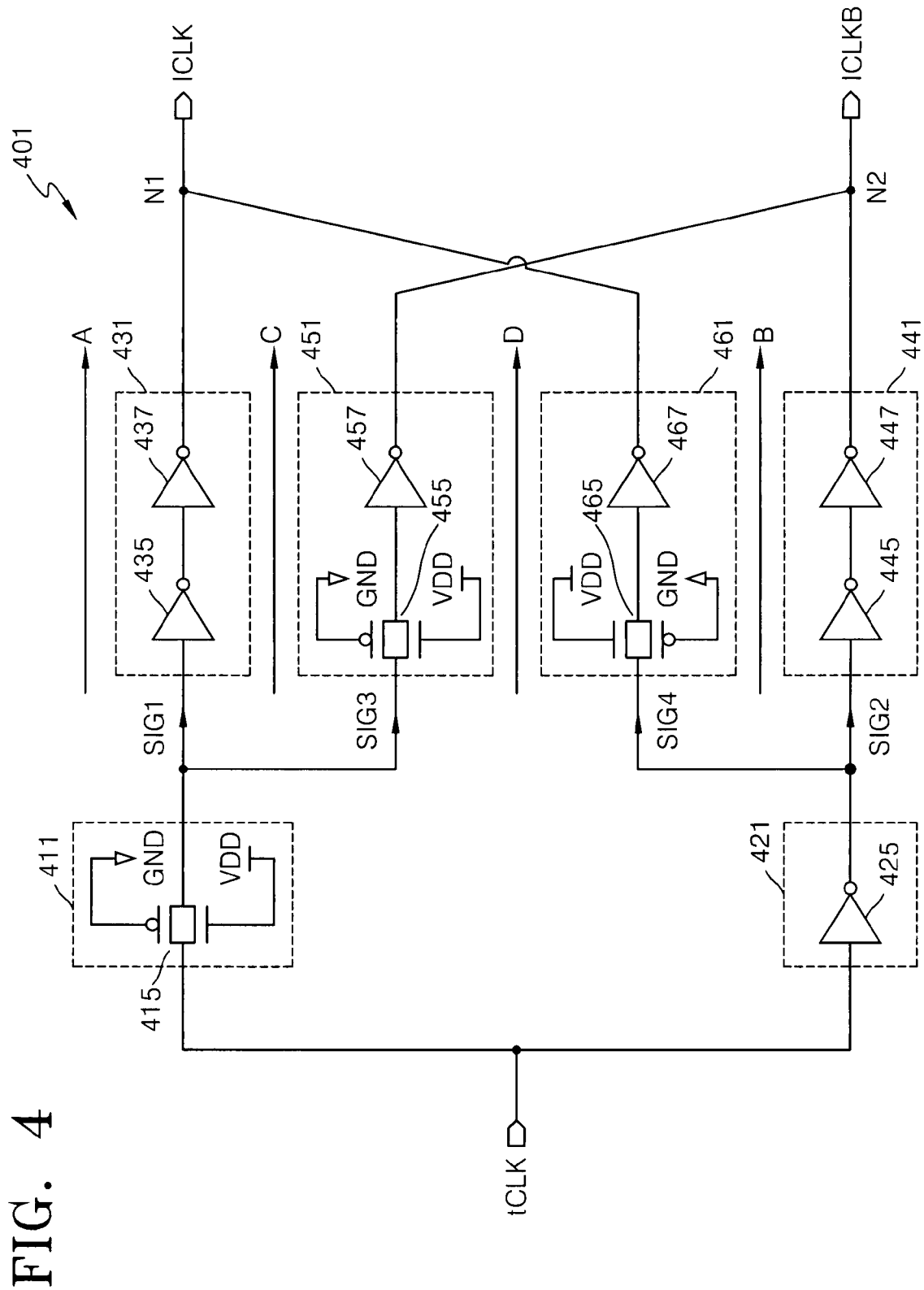
FIG. 4 is a circuit diagram of a phase splitter according to an example embodiment.

FIG. 4 is a circuit diagram of a phase splitter 401 according to an example embodiment. Referring to FIG. 4, the phase splitter 401 may include a transfer unit 411, an inverting unit 421, first buffer 431, second buffer 441, first interpolating signal generator 451, and/or second interpolating signal generator 461.

The transfer unit 411 may receive an external clock signal tCLK, may buffer the external clock signal tCLK, and/or may transfer the buffered external clock signal tCLK to the first buffer 431. The external clock signal tCLK outputted from the transfer unit 411 may be delayed by a period of time, which may or may not be predetermined, by the transfer unit 411. The transfer unit 411 may include a transfer gate 415 inputting and outputting the external clock signal tCLK. The transfer gate 415 may include a PMOS transistor and/or an NMOS transistor. The gate of the PMOS transistor of the transfer gate 415 may be coupled to a ground voltage GND or a substrate voltage VSS (not shown) and, thus, the PMOS transistor may be turned on while the phase splitter 401 is activated. The gate of the NMOS transistor of the transfer gate 415 may be coupled to a power supply voltage VDD and, thus, the NMOS transistor may be turned on while the phase splitter 401 is activated. That is, the transfer gate 415 may be turned on while the phase splitter 401 is in an active state.

The first buffer 431 may be connected to the transfer unit 411. The first buffer 431 may buffer the external clock signal tCLK outputted from the transfer unit 411 and may output a first internal clock signal ICLK. The first buffer 431 may include more than one inverter, connected in series. For example, the first buffer 431 may include an even number of inverters 435 and 437, connected in series. Thus, the external clock signal tCLK, inputted to the first buffer 431, may have the same phase as the first internal clock signal ICLK outputted from the first buffer 431. Furthermore, the first internal clock signal ICLK outputted from the first buffer 431 may be delayed by a period of time, which may or may not be predetermined, from the external clock signal tCLK inputted to the first buffer 431, because the first buffer 431 may include the inverters 435 and 437. The number of inverters included in the first buffer 431 may be, for example, determined according to the characteristics of the phase splitter 401. When the first buffer 431 has a large number of inverters, the delay of the first internal clock signal ICLK outputted from the first buffer 431 may be increased even though the buffering effect of the first buffer 431 is improved. In the example embodiment, the first buffer 431 includes only two inverters 435 and 437, in order to reduce the overall delay of the first internal clock signal ICLK.

The inverting unit 421 may receive the external clock signal tCLK and may invert the phase of the external clock signal tCLK by 180°. The inverting unit 421 may include an inverter 425.

The second buffer 441 may be connected to the inverting unit 421. The second buffer 441 may buffer the inverted external clock signal tCLK outputted from the inverting unit 421 and may output a second internal clock signal ICLKB. The second buffer 441 may include more than one inverter, connected in series. For example, the second buffer 441 may include an even number of inverters 445 and 447, connected in series. Thus, the external clock signal tCLK, inverted and inputted to the second buffer 441, may have the same phase as the second internal clock signal ICLKB outputted from the second buffer 441. Furthermore, the second internal clock signal ICLKB outputted from the second buffer 441 may be delayed by a period of time, which may or may not be predetermined, from the external clock signal tCLK inverted and inputted to the second buffer 441, because the second buffer 441 may include the inverters 445 and 447. The number of inverters included in the second buffer 441 may be, for example, determined according to the characteristics of the phase splitter 401. When the second buffer 441 has a large number of inverters, the delay of the second internal clock signal ICLKB outputted from the second buffer 441 may be increased even though the buffering effect of the second buffer 441 is improved. In the example embodiment, the second buffer 441 includes only two inverters 445 and 447, in order to reduce the overall delay of the second internal clock signal ICLKB.

The first interpolating signal generator 451 may be connected to the output terminal of the transfer unit 411. The first interpolating signal generator 451 may invert the output signal of the transfer unit 411 and/or may transmit the inverted signal to the output terminal of the second buffer 441. Thus, the signal outputted from the second buffer 441 may have the same phase as the signal outputted from the first interpolating signal generator 451. Accordingly, the phase of the second internal clock signal ICLKB may not be changed even when the output signal of the second buffer 441 and the output signal of the first interpolating signal generator 451 are coupled at a node N2.

The first interpolating signal generator 451 may include a transfer gate 455 and/or an inverter 457. The transfer gate 455 of the first interpolating signal generator 451 may be manufactured so that a delay of the transfer gate 455 of the first interpolating signal generator 451 is identical to a delay of the inverter 445 of the second buffer 441. Furthermore, the inverter 457 of the first interpolating signal generator 451 may be manufactured so that a delay of the inverter 457 of the first interpolating signal generator 451 is identical to a delay of the inverter 447 of the second buffer 441. Accordingly, the delay of the second buffer 441 may be equal to the delay of the first interpolating signal generator 451.

The second interpolating signal generator 461 may be connected to the output terminal of the inverting unit 421. The second interpolating signal generator 461 may invert the output signal of the inverting unit 421 and/or may transmit the inverted signal to the output terminal of the first buffer 431. Thus, the signal outputted from the first buffer 431 may have the same phase as the signal outputted from the second interpolating signal generator 461. Accordingly, the phase of the first internal clock signal ICLK may not be changed even when the output signal of the first buffer 431 and the output signal of the second interpolating signal generator 461 are coupled at a node N1.

The second interpolating signal generator 461 may include a transfer gate 465 and/or an inverter 467. The transfer gate 465 of the second interpolating signal generator 461 may be manufactured so that a delay of the transfer gate 465 of the second interpolating signal generator 461 is identical to a delay of the inverter 435 of the first buffer 431. Furthermore, the inverter 467 of the second interpolating signal generator 461 may be manufactured so that a delay of the inverter 467 of the second interpolating signal generator 461 is identical to a delay of the inverter 437 of the first buffer 431. Accordingly, the delay of the first buffer 431 may be equal to the delay of the second interpolating signal generator 461.

The inverter 435 of the first buffer 431 and the inverter 445 of the second buffer 441 may be of the same size and, thus, they may have the same delay. Consequently, the inverter 435 of the first buffer 431, the inverter 445 of the second buffer 441, the transfer gate 455 of the first interpolating signal generator 451, and/or the transfer gate 465 of the second interpolating signal generator 461 may have the same delay.

The inverter 437 of the first buffer 431, the inverter 447 of the second buffer 441, the inverter 457 of the first interpolating signal generator 451, and/or the inverter 467 of the second interpolating signal generator 461 may be of the same size. Accordingly, the inverter 437 of the first buffer 431, the inverter 447 of the second buffer 441, the inverter 457 of the first interpolating signal generator 451, and/or the inverter 467 of the second interpolating signal generator 461 may have the same delay. Consequently, the first buffer 431, the second buffer 441, the first interpolating signal generator 451, and/or the second interpolating signal generator 461 may have the same delay.

Even when the phase splitter 401 according to the example embodiment includes the first interpolating signal generator 451 and/or the second interpolating signal generator 461, the transfer gate 455 included in the first interpolating signal generator 451 and the transfer gate 465 included in the second interpolating signal generator 461 may have very low power consumption. Accordingly, power consumption of the phase splitter 401 of the example embodiment may not be significantly greater than that of the conventional phase splitter 101 illustrated in FIG. 1, even when the phase splitter 401 includes the first interpolating signal generator 451 and/or the second interpolating signal generator 461.

Furthermore, when the phase splitter 401 is manufactured through a semiconductor memory fabrication process, the inverter 457 included in the first interpolating signal generator 451 and/or the inverter 467 included in the second interpolating signal generator 461 may be formed in connection with the inverter 437 included in the first buffer 431 and/or the inverter 447 included in the second buffer 441. Accordingly, the size of the phase splitter 401 may be similar to that of the conventional phase splitter 101, even when the phase splitter 401 includes the first interpolating signal generator 451 and/or the second interpolating signal generator 461.

The phase splitter 401 may include first path A, second path B, third path C, and/or fourth path D. The phase splitter 401 may receive the external clock signal tCLK and may generate the first clock signal ICLK and/or the second internal clock signal ICLKB. That is, the external clock signal tCLK may travel through the first path A, the second path B, the third path C, and/or the fourth path D to be outputted as the first internal clock signal ICLK and/or the second internal clock signal ICLKB.

The output signal of the transfer unit 411 may arrive at the node N1 through the first path A and/or may arrive at the node N2 through the third path C. The output signal of the inverting unit 421 may arrive at the node N2 through the second path B and/or may arrive at the node N1 through the fourth path D. Accordingly, the signal that traveled through the first path A and the signal that traveled through the fourth path D may be interpolated at the node N1 to generate the first internal clock signal ICLK and/or the signal that traveled through the second path B and the signal that traveled through the third path C may be interpolated at the node N2 to generate the second internal clock signal ICLKB.

In the example embodiment, a difference between a delay of the transfer unit 411 and a delay of the inverting unit 421 may be generated. That is, the delay of the transfer unit 411 may be longer or shorter than the delay of the inverting unit 421. In FIG. 4, the delay of the inverter 425 included in the inverting unit 421 may be longer by a period of time, which may or may not be predetermined, than the delay of the transfer gate 415 included in the transfer unit 411. Accordingly, the signal that traveled through the first path A arrives at the node N1 prior to the signal that traveled through the fourth path D, and then the signal that traveled through the fourth path D arrives at the node N1 after a period of time, which may or may not be predetermined. In the example embodiment, the first buffer 431 and the first interpolating signal generator 451 may have the same delay and, thus, there may be no delay difference due to the first buffer 431 and the first interpolating signal generator 451. The signals that arrived at the node N1, having a time difference between them, may be interpolated.

Similarly, the signal that traveled through the third path C arrives at the node N2 prior to the signal that traveled through the second path B, and then the signal that traveled through the second path B arrives at the node N2 after a period of time, which may or may not be predetermined. In the example embodiment, the second buffer 441 and the second interpolating signal generator 461 may have the same delay, and thus, there may be no delay difference due to the second buffer 441 and the second interpolating signal generator 461. The signals that arrived at the node N2, having a time difference between them, may be interpolated.

As described above, the output signal of the transfer unit 411 and the output signal of the inverting unit 421 may travel through the first path A, the second path B, the third path C, and/or the fourth path D and may be interpolated at the nodes N1 and/or N2 so that a skew between the first internal clock signal ICLK and the second internal clock signal ICLKB may be significantly reduced. Furthermore, the skew between the first internal clock signal ICLK and the second internal clock signal ICLKB may be small even for a PVT variation because two or more of the first buffer 431, the second buffer 441, the first interpolating signal generator 451, and the second interpolating signal generator 461 may have the same delay.

Figure 5:
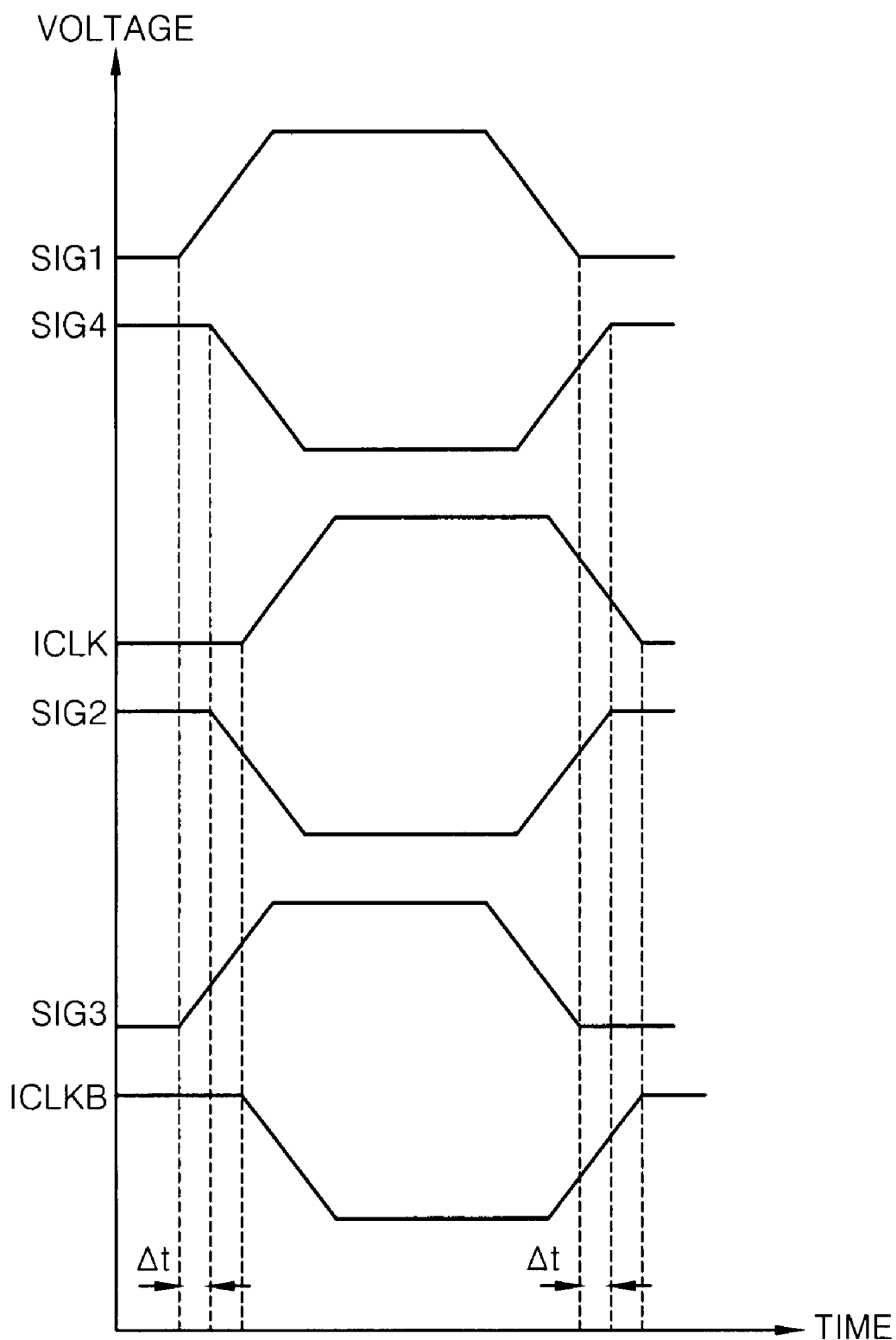
FIG. 5 is a timing diagram of signals illustrated in FIG. 4.

FIG. 5 is a timing diagram of signals SIG1, SIG2, SIG3, SIG4, ICLK, and ICLKB illustrated in FIG. 4. Referring to FIG. 5, the signal SIG1 outputted through the first path A (illustrated in FIG. 4) may be outputted prior to the signal SIG4 outputted through the fourth path D (illustrated in FIG. 4) by a time difference Δt, which may or may not be predetermined. Accordingly, the signal SIG1 outputted through the first path A and the signal SIG4 outputted through the fourth path D may be interpolated at the node N1 (illustrated in FIG. 4) in order to generate the first internal clock signal ICLK.

The signal SIG2 outputted through the second path B (illustrated in FIG. 4) may be delayed from the signal SIG3 outputted through the third path C (illustrated in FIG. 4) by a time difference Δt, which may or may not be predetermined. Thus, the signal SIG2 outputted through the second path B and the signal SIG3 output through the third path C may be interpolated at the node N2 (illustrated in FIG. 4) to generate the second internal clock signal ICLKB. Accordingly, the skew between the first internal clock signal ICLK and the second internal clock signal ICLKB may be reduced.

The operation of the phase splitter 401 illustrated in FIG. 4 will be explained with reference to FIG. 5.

The external clock signal tCLK may travel through the transfer unit 411 and the first path A to arrive at the node N1 and/or may travel through the inverting unit 421 and the fourth path D to arrive at the node N1. The signals that have respectively traveled through the first path A and the fourth path D may be interpolated and outputted from the node N1 as the first internal clock signal ICLK.

Furthermore, the external clock signal tCLK may travel through the inverting unit 421 and the second path B to arrive at the node N2 and/or may travel through the transfer unit 411 and the third path C to arrive at the node N2. The signals that have respectively traveled through the second path B and the third path C may be interpolated and outputted from the node N2 as the second internal clock signal ICLKB.

To calculate a falling skew and/or rising skew between the first internal clock signal ICLK and the second internal clock signal ICLKB, the delays of the transfer unit 411, the inverting unit 421, the first buffer 431, the second buffer 441, the first interpolating signal generator 451, and/or the second interpolating signal generator 461 may be defined as follows.

The delay of the transfer unit 411: t1.
The delay of the inverting unit 421: t1+Δt.
The delay of the first buffer 431 and/or the second buffer 441: t2.
The delay of the first interpolating signal generator 451 and/or the second interpolating signal generator 461: t3.

Thus, a delay D1 of the first internal clock signal ICLK and/or a delay D2 of the second internal clock signal ICLKB may be calculated as follows.

$$D1 = \frac{(t1+t2)\cdot n + (t1+\Delta t + t3)\cdot m}{n+m} \quad \text{[Equation 1]}$$

$$D2 = \frac{(t1+\Delta t + t2)\cdot n + (t1+t3)\cdot m}{n+m} \quad \text{[Equation 2]}$$

In the example embodiment, n may be a PVT parameter of the first buffer 431 and/or the second buffer 441, and m may be a PVT parameter of the first interpolating signal generator 451 and/or the second interpolating signal generator 461. The skew K between the first internal clock signal ICLK and the second internal clock signal ICLKB may be calculated as follows.

$$\begin{aligned} K &= D1 - D2 \quad \text{[Equation 3]} \\ &= \frac{(t1+t2)\cdot n + (t1+\Delta t + t3)\cdot m}{n+m} - \\ &\quad \frac{(t1+\Delta t + t2)\cdot n + (t1+t3)\cdot m}{n+m} \\ &= \frac{\Delta t(m-n)}{n+m} \end{aligned}$$

According to Equation 3, the skew K between the first internal clock signal ICLK and the second internal clock signal ICLKB may be determined by the PVT parameters of the first buffer 431 and/or the second buffer 441 and the first interpolating signal generator 451 and/or the second interpolating signal generator 461. That is, the skew between the first internal clock signal ICLK and the second internal clock signal ICLKB may increase when a difference between the PVT parameters of the first buffer 431 and/or the second buffer 441 and the first interpolating signal generator 451 and/or the second interpolating signal generator 461 increases. On the other hand, the skew between the first internal clock signal ICLK and the second internal clock signal ICLKB may decrease when the difference between the PVT parameters of the first buffer 431 and/or the second buffer 441 and the first interpolating signal generator 451 and/or the second interpolating signal generator 461 decreases.

The skew between the first internal clock signal ICLK and the second internal clock signal ICLKB may be completely removed when the PVT parameter of the first buffer 431 and/or the second buffer 441 is identical to the PVT parameter of the first interpolating signal generator 451 and/or the second interpolating signal generator 461. However, it may be difficult to make the PVT parameter of the first buffer 431 and/or the second buffer 441 identical to the PVT parameter of the first interpolating signal generator 451 and/or the second interpolating signal generator 461. Accordingly, one approach is to minimize the skew between the first internal clock signal ICLK and the second internal clock signal ICLKB by making the PVT parameter of the first buffer 431 and/or the second buffer 441 similar to the PVT parameter of the first interpolating signal generator 451 and/or the second interpolating signal generator 461.

Figure 6:
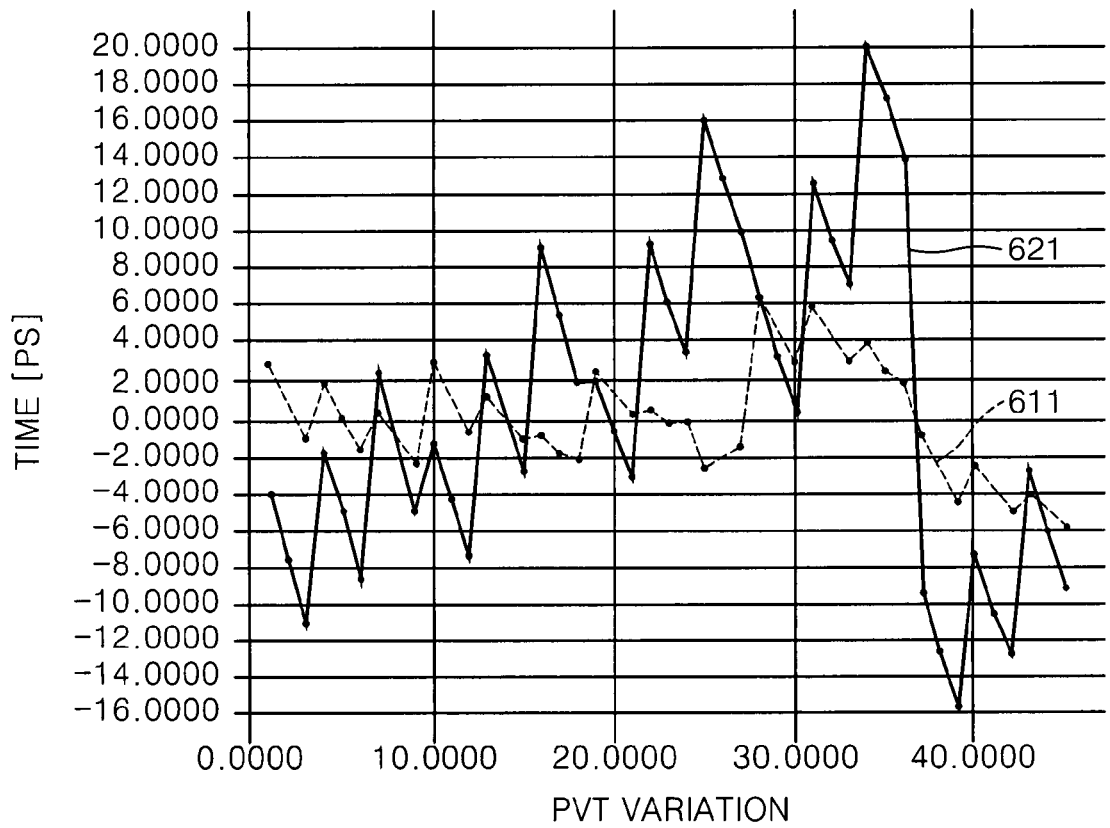
FIG. 6 illustrates a falling skew between first and second internal clock signals output from the phase splitter of FIG. 4 in response to PVT variations according to an example embodiment.

FIG. 6 illustrates the falling skew between the first internal clock signal ICLK and the second internal clock signal ICLKB outputted from the phase splitter 401 (illustrated in FIG. 4) in response to PVT variations as compared to the falling skew of the conventional phase splitter 101 (illustrated in FIG. 1), according to an example embodiment. In FIG. 6, the Y-axis represents variations in the falling skew between the first internal clock signal ICLK and the second internal clock signal ICLKB and the X-axis represents PVT variations (i.e., variations in process condition(s), power supply voltage(s), and/or temperature(s)).

For example, the process condition(s) may include ff (process conditions of a high-speed NMOS transistor and/or a high-speed PMOS transistor), tt (process conditions of a standard NMOS transistor and/or a standard PMOS transistor), ss (process conditions of a low-speed NMOS transistor and/or a low-speed PMOS transistor), fs (process conditions of a high-speed NMOS transistor and/or a low-speed PMOS transistor), and/or sf (process conditions of a low-speed NMOS transistor and/or a low-speed PMOS transistor). The power supply voltage(s) may include 2.0 V, 2.2 V, and/or 2.5 V. The temperature(s) may include 0° C., 55° C., and/or 11° C.

In a simulation of the falling skew between the first internal clock signal ICLK and the second internal clock signal ICLKB in response to PVT variations, a plurality of power supply voltages may be, for example, sequentially applied to the phase splitter 401 while the process conditions and temperature remain constant. In another simulation, the phase splitter 401 may be, for example, sequentially heated to a plurality of temperatures while the process conditions and power supply voltage remain constant. In yet another simulation, one or more process conditions may be changed, for example, while the power supply voltage and temperature remain constant. In further simulations, more than one of the process condition(s), power supply voltage(s), and temperature(s) may be changed, for example, individually, sequentially, or simultaneously.

As illustrated in FIG. 6, the falling skew 611 in response to a PVT variation in the phase splitter 401 of the example embodiment may have a variation range from about +7 picoseconds to about −6 picoseconds while the falling skew 621 in the conventional phase splitter 101 may have a variation range from about +20 picoseconds to about −16 picoseconds. That is, the variation range in the falling skew of the phase splitter 401 of the example embodiment may be significantly less than the variation range in the falling skew of the conventional phase splitter 101.

Figure 7:
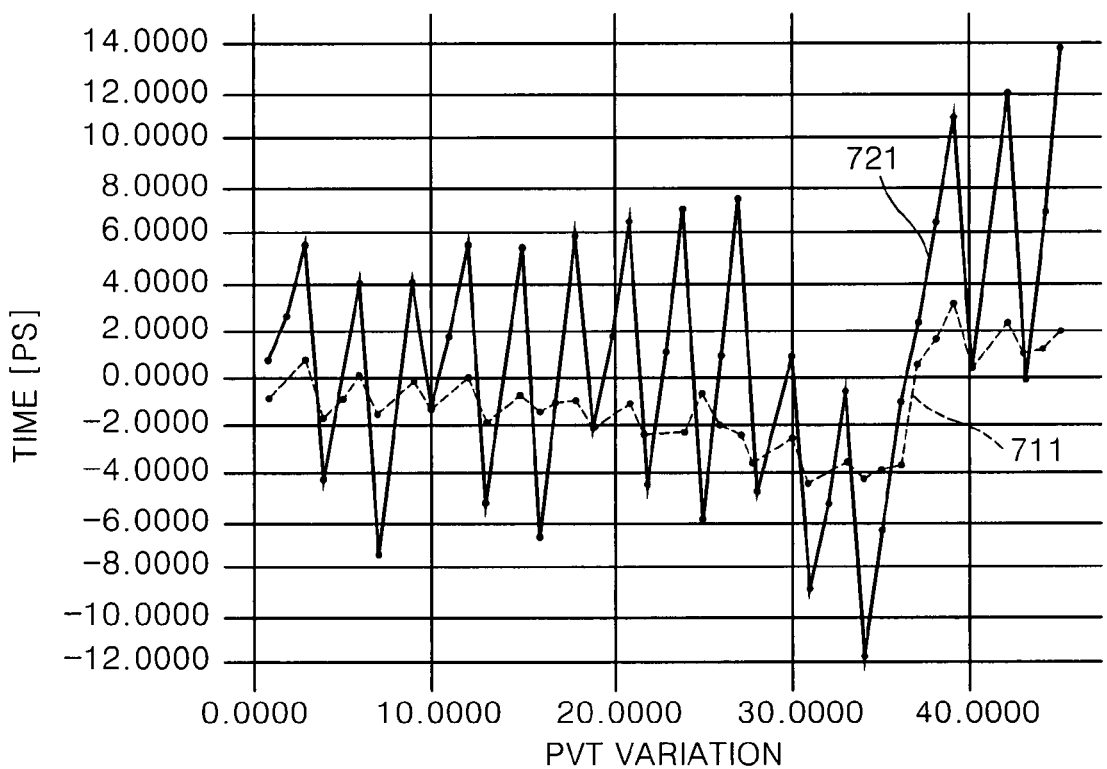
FIG. 7 illustrates a rising skew between first and second internal clock signals output from the phase splitter of FIG. 4 in response to PVT variations according to an example embodiment.

FIG. 7 illustrates the rising skew between the first internal clock signal ICLK and the second internal clock signal ICLKB outputted from the phase splitter 401 (illustrated in FIG. 4) in response to PVT variations as compared to the rising skew of the conventional phase splitter 101 (illustrated in FIG. 1), according to an example embodiment. In FIG. 7, the Y-axis represents variations in the rising skew between the first internal clock signal ICLK and the second internal clock signal ICLKB and the X-axis represents PVT variations (i.e., variations in process condition(s), power supply voltage(s), and/or temperature(s)).

The simulation of the rising skew between the first internal clock signal ICLK and the second internal clock signal ICLKB may be similar to the simulation of the falling skew between the first internal clock signal ICLK and the second internal clock signal ICLKB.

As illustrated in FIG. 7, the rising skew 711 in response to PVT variations in the phase splitter 401 of the example embodiment may have a variation range from about +3 picoseconds to about −4 picoseconds while the rising skew 721 in the conventional phase splitter 101 may have a variation range from about +14 picoseconds to about −12 picoseconds. That is, the variation range in the rising skew of the phase splitter 401 of the example embodiment may be significantly less than the variation range in the rising skew of the conventional phase splitter 101.

As described above, the phase splitter 401 according to the example embodiment may include the third path C and/or the fourth path D. The third path C may include the first interpolating signal generator 451, that itself may include the transfer gate 455 and/or the inverter 457. The fourth path D may include the second interpolating signal generator 461, that itself may include the transfer gate 465 and/or the inverter 467. The signal SIG1 propagated through the first path A and the signal SIG4 propagated through the fourth path D may be interpolated at the node N1 to generate the first internal clock signal ICLK. Furthermore, the signal SIG2 propagated through the second path B and the signal SIG3 propagated through the third path C may be interpolated at the node N2 to generate the second internal clock signal ICLKB. Accordingly, the skew between the first internal clock signal ICLK and the second internal clock signal ICLKB may be significantly reduced. Therefore, it may be possible to reduce or prevent the generation of error(s) in data output from a semiconductor memory device in which the phase splitter 401 according to the example embodiment is incorporated.

While example embodiments have been particularly shown and described, it will be understood by those of ordinary skill in the art that various changes in form and details may be made therein without departing from the spirit and scope of the present invention as defined by the following claims.

What is claimed is:

1. A phase splitter that receives an external clock signal and that generates first and second internal clock signals having a phase difference of 180° between the first and second internal clock signals, the phase splitter comprising:
   a first buffer that buffers the external clock signal and outputs a first signal;
   an inverting unit that inverts the external clock signal and outputs a second signal;
   a second buffer that buffers the second signal and outputs a third signal;
   a first interpolating signal generator that inverts the external clock signal and outputs a fourth signal; and
   a second interpolating signal generator that inverts the second signal and outputs a fifth signal;
   wherein the first signal and the fifth signal are interpolated to generate the first internal clock signal,
   wherein the third signal and the fourth signal are interpolated to generate the second internal clock signal, and
   wherein a delay of the first buffer is the same as a delay of the second interpolating signal generator.

2. The phase splitter of claim 1, further comprising:
a transfer unit that buffers the external clock signal and transfers the buffered external clock signal to the first buffer and the first interpolating signal generator.

3. The phase splitter of claim 2, wherein the transfer unit comprises:
a transfer gate that transfers the buffered external clock signal to the first buffer and the first interpolating signal generator.

4. The phase splitter of claim 2, wherein the transfer unit comprises:
a PMOS transistor; and
an NMOS transistor;
wherein a gate of the PMOS transistor is coupled to a ground voltage or a substrate voltage, and
wherein a gate of the NMOS transistor is coupled to a power supply voltage.

5. The phase splitter of claim 1, wherein the first buffer comprises more than one inverter connected in series.

6. The phase splitter of claim 1, wherein the first buffer comprises an even number of inverters connected in series.

7. The phase splitter of claim 1, wherein the second buffer comprises more than one inverter connected in series.

8. The phase splitter of claim 1, wherein the second buffer comprises an even number of inverters connected in series.

9. The phase splitter of claim 1, wherein the first interpolating signal generator comprises:
a transfer gate that transfers the external clock signal; and
an inverter that inverts the external clock signal.

10. The phase splitter of claim 1, wherein the first interpolating signal generator comprises:
a transfer gate that transfers the external clock signal; and
an inverter that inverts the external clock signal and outputs the fourth signal.

11. The phase splitter of claim 2, wherein the first interpolating signal generator comprises:
a transfer gate that transfers the buffered external clock signal; and
an inverter that inverts the buffered external clock signal.

12. The phase splitter of claim 2, wherein the first interpolating signal generator comprises:
a transfer gate that transfers the buffered external clock signal; and
an inverter that inverts the buffered external clock signal and outputs the fourth signal.

13. The phase splitter of claim 1, wherein the second interpolating signal generator comprises:
a transfer gate that transfers the second signal; and
an inverter that inverts the second signal.

14. The phase splitter of claim 1, wherein the second interpolating signal generator comprises:
a transfer gate that transfers the second signal; and
an inverter that inverts the second signal and outputs the fifth signal.

15. The phase splitter of claim 9, wherein the second buffer comprises more than one inverter connected in series, and
wherein a delay of a last inverter of the second buffer is the same as a delay of the inverter of the first interpolating signal generator.

16. The phase splitter of claim 13, wherein the first buffer comprises more than one inverter connected in series, and
wherein a delay of a last inverter of the first buffer is the same as a delay of the inverter of the second interpolating signal generator.

17. The phase splitter of claim 9, wherein the second buffer comprises more than one inverter connected in series, and
wherein a delay of a first inverter of the second buffer is the same as a delay of the transfer gate of the first interpolating signal generator.

18. The phase splitter of claim 13, wherein the first buffer comprises more than one inverter connected in series, and
wherein a delay of a first inverter of the first buffer is the same as a delay of the transfer gate of the second interpolating signal generator.

19. The phase splitter of claim 1, wherein a delay of the second buffer is the same as a delay of the first interpolating signal generator.

20. A phase splitter that receives an external clock signal and that generates first and second internal clock signals having a phase difference of 180° between the first and second internal clock signals, the phase splitter comprising:
a first buffer that buffers the external clock signal and outputs a first signal;
an inverting unit that inverts the external clock signal and outputs a second signal;
a second buffer that buffers the second signal and outputs a third signal;
a first interpolating signal generator that inverts the external clock signal and outputs a fourth signal; and
a second interpolating signal generator that inverts the second signal and outputs a fifth signal;
wherein the first signal and the fifth signal are interpolated to generate the first internal clock signal,
wherein the third signal and the fourth signal are interpolated to generate the second internal clock signal, and
wherein a delay of the second buffer is the same as a delay of the first interpolating signal generator.

21. A phase splitter that receives an external clock signal and that generates first and second internal clock signals having a phase difference of 180° between the first and second internal clock signals, the phase splitter comprising:
a first buffer that buffers the external clock signal and outputs a first signal;
an inverting unit that inverts the external clock signal and outputs a second signal;
a second buffer that buffers the second signal and outputs a third signal;
a first interpolating signal generator that inverts the external clock signal and outputs a fourth signal; and
a second interpolating signal generator that inverts the second signal and outputs a fifth signal;
wherein the first signal and the fifth signal are interpolated to generate the first internal clock signal,
wherein the third signal and the fourth signal are interpolated to generate the second internal clock signal, and
wherein delays of two or more of the first buffer, the second buffer, the first interpolating signal generator, and the second interpolating signal generator are the same.

22. The phase splitter of claim 21, wherein delays of the first buffer, the second buffer, the first interpolating signal generator, and the second interpolating signal generator are the same.

* * * * *